United States Patent
Zhang et al.

(10) Patent No.: US 9,529,069 B2
(45) Date of Patent: Dec. 27, 2016

(54) TEST SYSTEM FOR TESTING ELECTROSTATIC TESTER AND METHOD THEREOF

(71) Applicant: Shenzhen Airdrawing Technology Service Co., Ltd, Shenzhen (CN)

(72) Inventors: Gui-Zhen Zhang, Shenzhen (CN); Quan-Long Yang, Shenzhen (CN); Hung-Jen Tseng, New Taipei (TW)

(73) Assignee: Shenzhen Airdrawing Technology Service Co., Ltd, Shenzhen (CN)

(*) Notice: Subject to any disclaimer, the term of this patent is extended or adjusted under 35 U.S.C. 154(b) by 247 days.

(21) Appl. No.: 14/449,748

(22) Filed: Aug. 1, 2014

(65) Prior Publication Data
US 2015/0042356 A1    Feb. 12, 2015

(30) Foreign Application Priority Data
Aug. 6, 2013    (CN) .................. 2013 1 03391356

(51) Int. Cl.
*G01R 35/00*    (2006.01)
*G01R 31/12*    (2006.01)
G01R 31/00    (2006.01)

(52) U.S. Cl.
CPC ............. *G01R 35/00* (2013.01); *G01R 31/001* (2013.01)

(58) Field of Classification Search
CPC ......... G01R 31/08; G01R 31/00; G01R 31/28; G01R 31/308; G01R 31/12; G01R 35/00
USPC ........ 324/537, 753, 532; 714/724, 734, 735, 714/738; 250/227.11, 559.45, 559.46; 385/14, 3
See application file for complete search history.

(56) References Cited

U.S. PATENT DOCUMENTS

| | | | |
|---|---|---|---|
| 6,586,953 B1 * | 7/2003 | Okayasu | G01R 31/311 324/750.15 |
| 2012/0098461 A1 * | 4/2012 | Xie | G01R 29/18 315/297 |

* cited by examiner

*Primary Examiner* — Jermele M Hollington
*Assistant Examiner* — Zannatul Ferdous
(74) *Attorney, Agent, or Firm* — Zhigang Ma

(57) ABSTRACT

A test system for testing electrostatic testers, is used to test at least one electrostatic tester each including a voltage test terminal and a connection test terminal. The test system includes at least one optical coupler circuit and a chip. Each optical coupler circuit is coupled the voltage test terminal and the connection test terminal of one corresponding electrostatic tester, and each optical coupler circuit converts voltages of the voltage test terminal and the connection test terminal respectively to a voltage test signal and a connection test signal. The chip is couple to the at least one optical coupler circuit, and receives the connection test signal and the voltage test signal produced by the at least one optical coupler circuit, and determines whether the corresponding electrostatic tester connected to each optical coupler circuit is worked normally according to the connection test signal and the voltage test signal.

16 Claims, 5 Drawing Sheets

TAB1

| Name | Connection test signal | Voltage test signal | Test result | Test time |
|---|---|---|---|---|
| Electrostatic tester 1 | None | Digital-low | OFF | 9: 00 AM |
| Electrostatic tester 2 | Digital-high | Digital-low | Abnormal | 9: 00 AM |
| Electrostatic tester 3 | Digital-low | Digital-low | Normal | 9: 00 AM |

FIG. 3

TEST SYSTEM FOR TESTING ELECTROSTATIC TESTER AND METHOD THEREOF

CROSS-REFERENCE TO RELATED APPLICATIONS

This application claims priority to Chinese Patent Application No. 201310339135.6 filed on Aug. 6, 2013 in the China Intellectual Property Office, the contents of which are incorporated by reference herein.

FIELD

The present disclosure relates to test systems, and particularly to a test system for testing electrostatic testers, and a method thereof

BACKGROUND

Usually, in a production workshop for producing electronic devices, in order to protect an electronic device from damage due to electronic static discharge (ESD), personnel of the production workshop often wear an ESD wrist strap. Accordingly, the ESD wrist straps need to be tested.

BRIEF DESCRIPTION OF THE DRAWINGS

Implementations of the present technology will now be described, by way of example only, with reference to the attached figures.

FIG. 3 is a diagrammatic view of an embodiment of a logical table.

DETAILED DESCRIPTION

Figure 1:
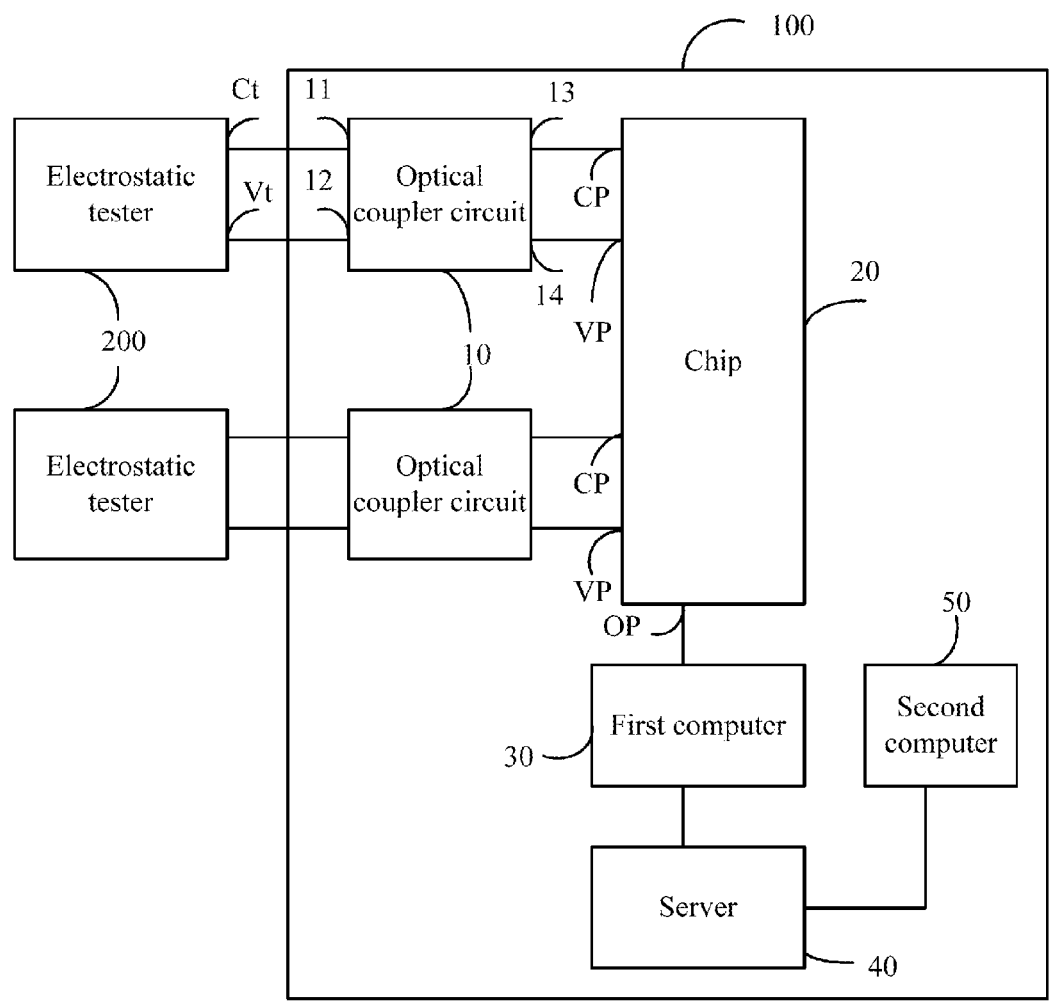
FIG. 1 is a block diagram of an embodiment of a test system for testing electrostatic testers.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 illustrates a test system 100 for testing/evaluating an electrostatic tester 200 of the disclosure. The test system 100 is used to test at least one electrostatic tester 200. Each electrostatic tester 200 is located on a production line of a production workshop.

The test system 100 includes at least one optical coupler circuit 10 and a chip 20. Each electrostatic tester 200 includes a voltage test terminal Vt and a connection test terminal Ct. Each optical coupler circuit 10 is used to connect to the voltage test terminal Vt and the connection test terminal Ct of one corresponding electrostatic tester 200, and convert voltages of the voltage test terminal Vt and the connection test terminal Ct respectively to a voltage test signal and a connection test signal. The chip 20 can be a single chip, a central processing unit, a digital signal processor, for example.

The chip 20 is connected to the at least one optical coupler circuit 10, and receives the connection test signal and the voltage test signal produced by the optical coupler circuit 10, and determines whether the corresponding electrostatic tester 200 connected to each optical coupler circuit 10 is working normally according to the connection test signal and the voltage test signal produced by the corresponding optical coupler circuit 10.

As shown in FIG. 1, in detail, each optical coupler circuit 10 includes a first input port 11, a second input port 12, a first output port 13, and a second output port 14. The first input port 11 is used to connect to the connection test terminal Vt of the corresponding electrostatic tester 200 and obtain the voltage of the connection test terminal Vt, the second input port 12 is used to connect to the voltage test terminal Vt of the corresponding electrostatic tester 200 and obtain the voltage of the voltage test terminal Vt. The optical coupler circuit 10 coverts the voltage of the connection test terminal Vt to the connection test signal and converts the voltage of the voltage test terminal Vt to the voltage test signal, and outputs the connection test signal and the voltage test signal respectively via the first output port 13 and the second output port 14.

The chip 20 includes a number of connection detection pins CP and a number of voltage detection pins VP. The connection detection pins CP and the voltage detection pins VP are respectively corresponded to each other and constitute a number of pin couples. The connection detection pin CP and the voltage detection pin VP of one pin couple are respectively connected to the first output port 13 and the second output port 14 of one optical coupler circuit 10. In detail, each connection detection pin CP is connected to one first output port 13 of the optical coupler circuit 10, and the corresponding voltage detection pin VP is connected to the second output port 14 of the same optical coupler circuit 10. Thus, the chip 20 obtains the connection test signal of the optical coupler circuit 10 via the corresponding connection detection pin CP and obtains the voltage test signal of the optical coupler circuit 10 via the corresponding voltage detection pin VP.

Because each electrostatic tester 200 connects to one corresponding optical coupler circuit 10, and each optical coupler circuit 10 connects to one corresponding pin couple including one connection detection pin CP and one voltage detection pin VP. The chip 20 can determine the optical coupler circuit 10 according to the connection detection pin CP receiving the connection test signal and the voltage detection pin VP receiving the voltage test signal, and then determine the electrostatic tester 200 connected to the optical coupler circuit 10, and then associate the electrostatic tester 200 and a test result determined by the connection test signal and the voltage test signal. Thus to obtain the test result of each electrostatic tester 200.

In the embodiment, the test system 100 further includes a first computer 30. The chip 20 further connects to the first computer 30 and transmits the test result of each electrostatic tester 200 to the first computer 30. The first computer 30 can display the test result in response to user operation. In another embodiment, the test system 100 further includes an indication circuit (not shown), the indication circuit is connected to the chip 20 and is used to produce corresponding indication signals according to the test result determined by the chip 20. The indication circuit 20 can be a loud speaker or a light-emitting diode (LED) module. For example, the indication circuit 20 can include a number of LEDs and each LED corresponds to one electrostatic tester 200, the indication circuit 20 controls the corresponding LEDs to turn on or off according to the test result of the corresponding electrostatic tester 200.

In the embodiment, the optical coupler circuit 10 inverts the voltage of the connection test terminal Ct and the voltage test terminal Vt to obtain the connection test signal and the voltage test signal. In the embodiment, when the voltage of the connection test terminal Ct and the voltage test terminal Vt of one electrostatic tester 200 are digital-high, the corresponding electrostatic tester 200 is worked/functioning normally. Therefore, when the connection test signal and the voltage test signal of one electrostatic tester 200 are both digital-low, the chip 20 determines the electrostatic tester 200 is worked normally and obtain the corresponding test result is "normal". Else, the chip 20 determines the electrostatic tester 200 is worked abnormally and obtain the corresponding test result is "abnormal".

Figure 2:
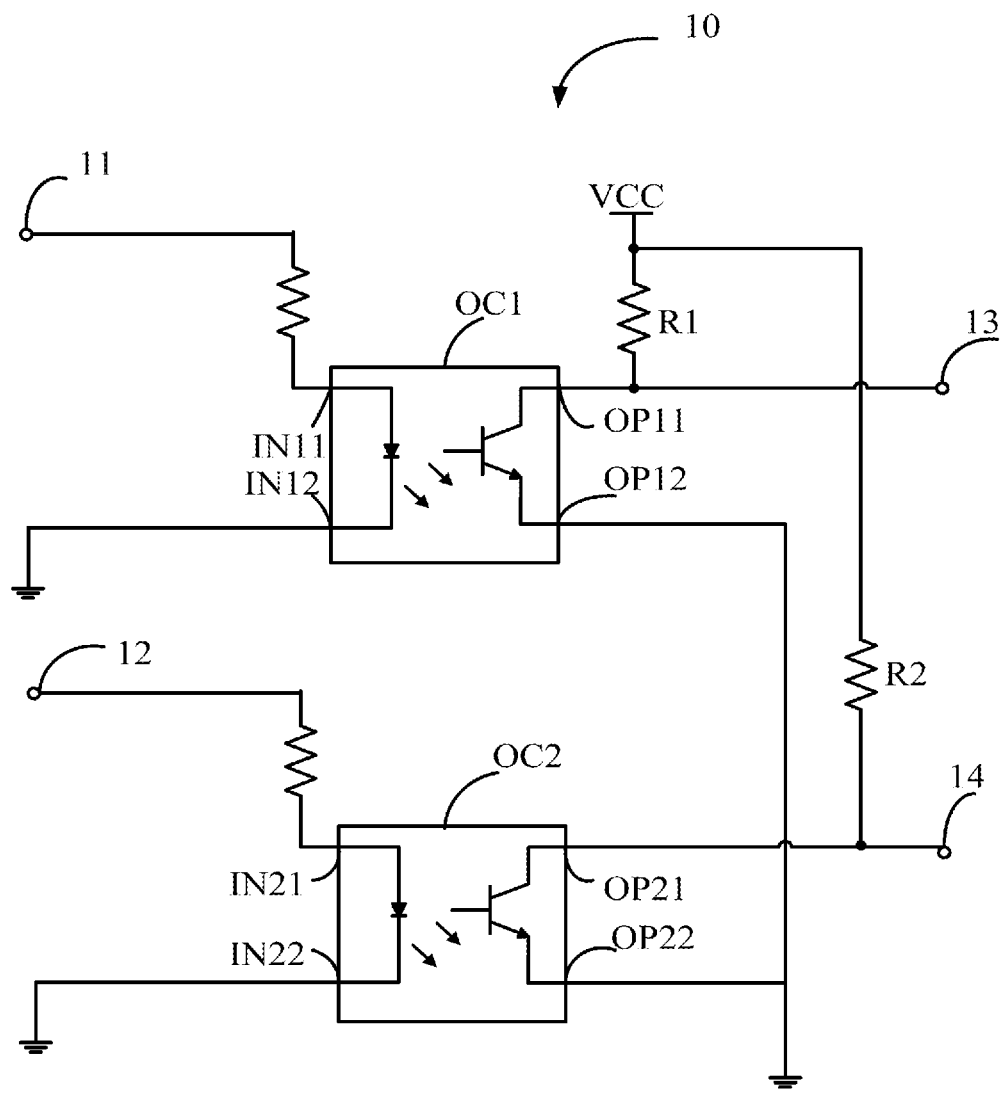
FIG. 2 is a circuit diagram of an embodiment of an optical coupler of a test system for testing an electrostatic tester.

Referring also to FIG. 2, a circuit of the optical coupler circuit 10 is shown. The optical coupler circuit 10 includes a first optical coupler OC1, a second optical coupler OC2, a voltage port VCC, and resistors R1, R2. The first optical coupler OC1 includes a first input terminal IN11, a second input terminal IN12, a first output terminal OP11, and a second output terminal OP12. The first input terminal IN11 is coupled to the first input port 11, the second input terminal IN12 is grounded, the first output terminal OP11 is coupled to the first output port 13 and is coupled to the voltage port VCC via the resistor R1, the second output terminal OP12 is grounded.

The second optical coupler OC2 includes a third input terminal IN21, a fourth input terminal IN22, a third output terminal OP21, and a fourth output terminal OP22. The third input terminal IN21 is coupled to the second input port 12, the fourth input terminal IN22 is grounded, the third output terminal OP21 is coupled to the second output port 14 and is further coupled to the voltage port VCC via the resistor R, the fourth output terminal OP22 is grounded. The voltage port VCC is used to provide a digital-high voltage, such as 5 volts.

When the voltage of the connection test terminal Ct of the electrostatic tester 200 is digital-high, the first input terminal IN11 of the first optical coupler OC1 obtains the voltage of the connection test terminal Ct and is at digital-high too, the first optical coupler OC1 is turned on accordingly. Thus causing the first output port 13 of the optical coupler circuit 10 to be grounded via the first optical coupler OC1 which is turned on, and to output the connection test signal with digital-low accordingly.

When the voltage of the connection test terminal Ct of the electrostatic tester 200 is digital-low, the first input terminal IN11 of the first optical coupler OC1 obtains the voltage of the connection test terminal Ct and is at digital-low too, the first optical coupler OC1 is turned off accordingly. The first output port 13 of the optical coupler circuit obtains a digital-high voltage from the voltage port VCC via the resistor R1, thus to output the connection test signal with digital-high accordingly.

Similarly, when the voltage of the voltage test terminal Vt of the electrostatic tester 200 is digital-high, the third input terminal IN21 of the second optical coupler OC2 obtains the voltage of the voltage test terminal Vt and is at digital-high too, the second optical coupler OC2 is turned on accordingly. The second output port 14 of the optical coupler circuit 10 is grounded via the second optical coupler OC2 which is turned on, thus to output the voltage test signal with digital-low accordingly.

When the voltage of the voltage test terminal Vt of the electrostatic tester 200 is digital-low, the third input terminal IN21 of the second optical coupler OC2 obtains the voltage of the voltage test terminal Vt and is at digital-low too, the second optical coupler OC2 is turned off accordingly. The second output port 14 of the optical coupler circuit 10 obtains a digital-high voltage from the voltage port VCC via the resistor R2 and outputs the voltage test signal with digital-high accordingly.

Referring to FIG. 3 together, the chip 20 further establishes a number of logical tables TAB1 each corresponding to a time point according to the time when the chip 20 receiving the connection test signal and the voltage test signal, each logical table TAB1 includes a name column, a voltage test signal column, a connection test signal column, a test result column, and a test time column for recording corresponding test data of at least one electrostatic tester 200. In detail, the name column records names of the at least one electrostatic tester 200. For example, the name column records electrostatic tester 1, electrostatic tester 2, and electrostatic tester 3. The voltage test signal column records the voltage of the voltage test signal, and the connection test signal column records the voltage of the connection test signal. The test result column records the test result of each electrostatic tester 200, and the test time column records the test time for each electrostatic tester 200. The test data of each electrostatic tester 200 include data recorded in the columns.

In the logical table TAB1, when the voltage test signal and the connection test signal of one electrostatic tester 200 are digital low, thus representing the electrostatic tester 200 is worked normally, then the test result of the electrostatic tester 200 is "normal". When the voltage of the connection test signal of one electrostatic tester 200 is empty, thus representing the electrostatic tester 200 is turned off, and the test result of the electrostatic tester 200 is "OFF". When the voltage of connection test signal of one electrostatic tester 200 is digital-high, thus representing the electrostatic tester 200 is worked abnormally, and the test result of the corresponding electrostatic tester 200 is "abnormal".

The chip 20 further transmits the number of logical table TAB1 corresponding to each time point to the first computer 30. In the embodiment, the chip 20 can connect to the first computer 30 via a USB port, a IEEE1394 port, a serial port, for example. In the embodiment, the chip 20 receives the connection test signal and the voltage test signal of each optical coupler circuit 10 at intervals (such as every 5 seconds), thereby producing the number of logical table TAB1 in sequence. The chip 20 then transmits the number of logical table TAB1 to the first computer 30 in sequence.

In the embodiment, the test system further includes a server 40, the server 40 is connected to the first computer 30 via a wireless mode or a wire mode. The first computer 30 further transmits the logical tables TAB1 to the server 40 after receiving the logical tables TAB1 from the chip 20.

Figure 4:
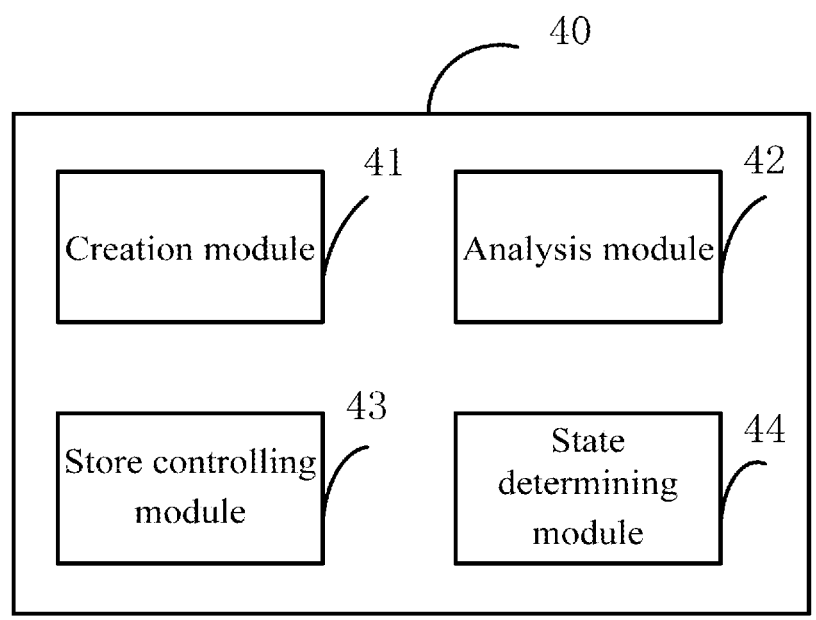
FIG. 4 is a block diagram of an embodiment of a server of a test system for testing an electrostatic tester.

Referring also to FIG. 4, a block diagram of the server 40 is shown. The server 40 includes a creation module 41, an analysis module 42, a store controlling module 43, and a state determining module 44. The creation module 41 is used to create a number of database tables, the database tables at least include a work time database table and a rest time database table. The work time database table is used to record the test data of the electrostatic tester 200 during the work time (for example, from 8:00 AM to 17:30 PM), and the rest time database table is used to record the test data of the electrostatic tester 200 during the rest time (for example, from 17:30 PM to 8:00 AM).

The analysis module 42 is used to analyze the logical table TAB1 transmitted by the first computer 30, and compare the test time of the logical table TAB1 to a preset work schedule, thus to determine which duration the test time of the logical table TAB1 is belonged. The analysis module 42 further determines a production line number corresponding to the test result of each electrostatic tester 200 according to relationships between the electrostatic testers 200 and the production lines. As described above, each production line has set one electrostatic testers 200 and has a corresponding production line number, therefore, each production line number is corresponded to one corresponding electrostatic tester 200. The relationships between the electrostatic testers 200 and the production lines can be pre-edited and uploaded to the server 40. The work schedule can be preset according to the work time and the rest time of the workshop.

The store controlling module 43 is used to associate the production line number, the test result, and the test time of each electrostatic tester 200 with each other and store the associated data including the production line number, test result, and test time of each electrostatic tester 200 to the corresponding database table according to the test time. For example, when the test time of the logical table TAB1 belongs to the work time of the work schedule, the store controlling module 43 stores the associated production line number, test result, and test time of each electrostatic tester 200 to the work time database table. Accordingly, when the test time of the logical table TAB1 belongs to the rest time of the work schedule, the store controlling module 43 stores the associated production line number, test result, and test time of each electrostatic tester 200 to the rest time database table.

The state determining module 44 is used to determine whether a state of the electrostatic tester 200 corresponding to each production line number is normal according to the associated data stored in each database table, namely the work time database table and the rest time database table. In detail, when the state determining module 44 determines a number of the test result of one electrostatic tester 200 of the work time database table determined as "abnormal" is greater than a first predetermined times (such as 15 times), the state determining module 44 then determines the state of the electrostatic tester 200 is abnormal. Else, the state determining module 44 determines the state of the electrostatic tester 200 is normal. In more detail, the state determining module 44 determines the state of the electrostatic tester 200 is abnormal when determining a number of the test result of the electrostatic tester 200 of the work time database table determined as "abnormal" is greater than a predetermined time (such as 15 times) within a predetermined duration, such as ten minutes.

When the state determining module 44 determines a number of the test result of one electrostatic tester 200 of the rest time database table determined as "normal" is greater than a second predetermined times (such as 180 times) within the predetermined duration, the state determining module 44 then determines the state of the electrostatic tester 200 is abnormal. Else, the state determining module 44 determines the state of the electrostatic tester 200 is normal.

Ideally, the test result of each electrostatic tester 200 should be "normal". In the rest time, the test result of each electrostatic tester 200 should be "abnormal" or "OFF", if the test result of the electrostatic tester 200 maintains to "normal" in the rest time, the state of the electrostatic tester 200 would be abnormal.

In the embodiment, as shown in FIG. 1, the test system 100 further includes at least one second computer 50. The second computer 50 can connect to the server 40 to obtain a state of one product line and display the state of the product line in response to user operation on the second computer 50. In the embodiment, the second computer 50 accesses a search interface provided by the server 40 to search the state of the product line.

In another embodiment, the user can obtain the test result of each electrostatic tester 20 corresponding to each production line via the first computer 30, and then the user can determine whether the state of the production line is normal according to the test time and the test result by manpower. For example, the user can determine the state of the production line is normal when determining the test time is belonged to the work time and the test result is "normal".

In another embodiment, the first computer 30 further inserts an internal protocol (IP) address of the first computer 30 and a check code into the logical table TAB1 when receiving the logical table TAB1. The analysis module 42 determines that whether the data of the name column, the voltage test signal column, the connection test signal column, the test result column, and the test time column are corresponded to the check code. If the data of the above columns are not corresponded to the check code, the analysis module 42 sends a resend instruction to the first computer 30 via the IP address of the first computer 30, thus to trigger the first computer 30 to resend the logical table TAB1.

Figure 5:
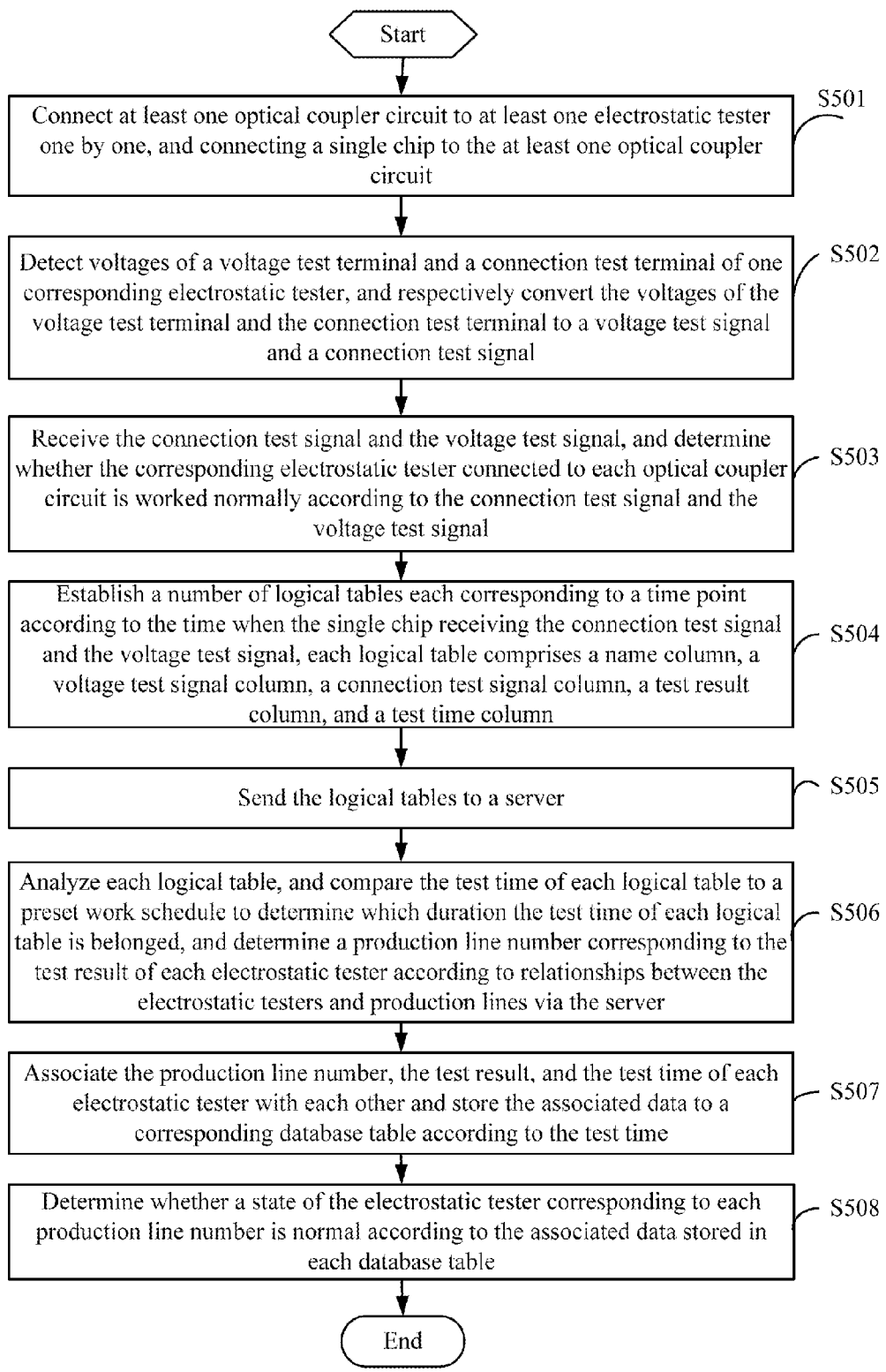
FIG. 5 is a flowchart diagram of an embodiment of a test method for testing electrostatic testers.

FIG. 5 illustrates a flowchart of a method for testing electrostatic testers. In block 501, connecting at least one optical coupler circuit to at least one electrostatic tester one by one, and connecting a chip to the at least one optical coupler circuit.

In block 502, each optical coupler circuit detects voltages of a voltage test terminal and a connection test terminal of one corresponding electrostatic tester, and respectively convert the voltages of the voltage test terminal and the connection test terminal to a voltage test signal and a connection test signal.

In block 503, the chip receives the connection test signal and the voltage test signal produced by each optical coupler circuit, and determines whether the corresponding electrostatic tester connected to each optical coupler circuit is worked normally according to the connection test signal and the voltage test signal produced by the corresponding optical coupler circuit, thus to obtain a test result of each electrostatic tester. In detail, the when the connection test signal and the voltage test signal of one electrostatic tester are both digital-low, the chip determines the electrostatic tester is worked normally and obtain the corresponding test result is "normal", else, the chip determines the electrostatic tester is worked abnormally or is turned off.

In block 504, the chip further establishes a number of logical tables each corresponding to a time point according to the time when the chip receiving the connection test signal and the voltage test signal, each logical table includes a name column, a voltage test signal column, a connection test signal column, a test result column, and a test time column for recording corresponding test data of the corresponding electrostatic tester.

In block 505, the first computer sends the logical tables to a server in sequence.

In block 506, an analysis module analyzes each logical table transmitted by the first computer, and compare the test time of each logical table to a preset work schedule, thus to determine which duration the test time of each logical table is belonged, the analysis module further determines a production line number corresponding to the test result of each electrostatic tester according to relationships between the electrostatic testers and production lines.

In block 507, a store controlling module associates the production line number, the test result, and the test time of each electrostatic tester with each other and store the associated data including the production line number, test result, and test time of each electrostatic tester to a corresponding database table according to the test time. In detail, when the test time of the logical table belongs to the work time of the work schedule, the store controlling module stores the associated data of each electrostatic tester to a work time database table. When the test time of the logical table belongs to the rest time of the work schedule, the store controlling module stores the associated data of each electrostatic tester to a rest time database table.

In block 508, a state determining module determine whether a state of the electrostatic tester corresponding to each production line number is normal according to the associated data stored in each database table. In detail, when the state determining module determines a number of the test result of one electrostatic tester of the work time database table determined as "abnormal" is greater than a first predetermined times (such as 15 times), the state determining module determines the state of the electrostatic tester is abnormal. Else, the state determining module determines the state of the electrostatic tester is normal. When the state determining module determines a number of the test result of one electrostatic tester of the rest time database table determined as "normal" is greater than a second predetermined times (such as 180 times) within the predetermined duration, the state determining module determines the state of the electrostatic tester is abnormal. Else, the state determining module determines the state of the electrostatic tester is normal.

In the embodiment, the method further includes: a second computer connects to the server to obtain a state of one product line and display the state of the product line in response to user operation on the second computer.

It is believed that the present embodiments and their advantages will be understood from the foregoing description, and it will be apparent that various changes may be made thereto without departing from the scope of the disclosure or sacrificing all of its material advantages, the examples hereinbefore described merely being exemplary embodiments of the present disclosure.

What is claimed is:

1. A test system for testing at least one electrostatic tester having a voltage test terminal and a connection test terminal, the test system comprising:
at least one optical coupler circuit, each optical coupler circuit being coupled to the voltage test terminal and the connection test terminal of one corresponding electrostatic tester, and each optical coupler circuit being configured to convert voltages of the voltage test terminal and the connection test terminal to a voltage test signal and a connection test signal respectively; and
a chip configured to couple to the at least one optical coupler circuit, and to receive the connection test signal and the voltage test signal produced by the at least one optical coupler circuit, and determine whether the corresponding electrostatic tester connected to each optical coupler circuit is functioning normally according to the connection test signal and the voltage test signal produced by the corresponding optical coupler circuit.

2. The test system according to claim 1, wherein each optical coupler circuit comprises an input port, a second input port, a first output port, and a second output port; the first input port is configured to connect to the connection test terminal of the corresponding electrostatic tester and obtain the voltage of the connection test terminal, the second input port is configured to connect to the voltage test terminal of the corresponding electrostatic tester and obtain the voltage of the voltage test terminal; the optical coupler circuit coverts the voltage of the connection test terminal to the connection test signal and converts the voltage of the voltage test terminal to the voltage test signal, and outputs the connection test signal and the voltage test signal respectively via the first output port and the second output port.

3. The test system according to claim 2, wherein the chip comprises a plurality of connection detection pins and a plurality of voltage detection pins; the connection detection pins and the voltage detection pins are respectively corresponded to each other and constitute a number of pin couples; the connection detection pin and the voltage detection pin of one pin couple are respectively coupled to the first output port and the second output port of one corresponding optical coupler circuit.

4. The test system according to claim 3, wherein the optical coupler circuit inverts the voltage of the connection test terminal and the voltage test terminal to obtain the connection test signal and the voltage test signal; when the voltage of the connection test terminal and the voltage test terminal of one electrostatic tester are digital-high, the corresponding electrostatic tester is worked normally, when the connection test signal and the voltage test signal of one electrostatic tester are both digital-low, the chip determines the electrostatic tester is worked normally.

5. The test system according to claim 4, wherein each optical coupler circuit comprises a first optical coupler, a second optical coupler, a voltage port, a first resistor, and a second resistor; the first optical coupler comprises a first input terminal, a second input terminal, a first output terminal, and a second output terminal, the first input terminal is coupled to the first input port, the second input terminal is grounded, the first output terminal is coupled to the first output port and is coupled to the voltage port via the first resistor, the second output terminal is grounded; the second optical coupler comprises a third input terminal, a fourth input terminal, a third output terminal, and a fourth output terminal, the third input terminal is coupled to the second input port, the fourth input terminal is grounded, the third output terminal is coupled to the second output port and is further coupled to the voltage port via the second resistor, the fourth output terminal is grounded.

6. The test system according to claim 4, wherein the chip is further configured to establishes a plurality of logical tables each corresponding to a time point according to the time when the chip receiving the connection test signal and the voltage test signal, each logical table comprises a name column, a voltage test signal column, a connection test signal column, a test result column, and a test time column for recording corresponding test data of at least one electrostatic tester, the name column is configured to record name of the at least one electrostatic tester; the voltage test signal column is configured to record the voltage of the voltage test signal, the connection test signal column is configured to record the voltage of the connection test signal, the test result column is configured to record the test result of each electrostatic tester, and the test time column is configured to record the test time for each electrostatic tester.

7. The test system according to claim 6, further comprising a server, wherein the server comprises a creation module, an analysis module, a store controlling module, and a state determining module; the creation module is configured to create a plurality of database tables comprising a work time database table and a rest time database table; the analysis module is configured to analyze the logical table transmitted by the first computer 30, and compare the test time of the logical table to a preset work schedule, thus to determine which duration the test time of the logical table is belonged, the analysis module is further configured to determine a production line number corresponding to the test result of each electrostatic tester according to relationships between the electrostatic testers and the production lines; the store controlling module is configured to associate the production line number, the test result, and the test time of each electrostatic tester with each other and store the associated data comprising the production line number, test result, and test time of each electrostatic tester to the corresponding database table according to the test time; and the state determining module is configured to determine whether a state of the electrostatic tester corresponding to each production line number is normal according to the associated data stored in the work time database table and the rest time database table.

8. The test system according to claim 7, wherein when the test time of the logical table belongs to the work time of the work schedule, the store controlling module stores the associated production line number, test result, and test time of each electrostatic tester to the work time database table; when the test time of the logical table belongs to the rest time of the work schedule, the store controlling module stores the associated production line number, test result, and test time of each electrostatic tester to the rest time database table.

9. The test system according to claim 7, wherein when the state determining module determines a number of the test result of one electrostatic tester of the work time database table determined as "abnormal" is greater than a first predetermined times, the state determining module determines the state of the electrostatic tester is abnormal; and when the state determining module determines a number of the test result of one electrostatic tester of the rest time database table determined as "normal" is greater than a second predetermined times within the predetermined duration, the state determining module determines the state of the electrostatic tester is abnormal.

10. The test system according to claim 8, further comprising a first computer, the chip further connects to the first computer and transmits the test result of each electrostatic tester and the logical tables to the first computer, the first computer is configured to transmit the logical tables to the server after receiving the logical tables from the chip.

11. The test system according to claim 8, further comprising at least one second computer, the second computer is configured to connect to the server to obtain a state of at least one product line and display the state of the at least one product line in response to user operation on the second computer.

12. A method for test electrostatic tester comprising:
connecting at least one optical coupler circuit to at least one electrostatic tester one by one, and connecting a chip to the at least one optical coupler circuit;
detecting voltages of a voltage test terminal and a connection test terminal of one corresponding electrostatic tester, and respectively converting the voltages of the voltage test terminal and the connection test terminal to a voltage test signal and a connection test signal, via each optical coupler circuit;
receiving the connection test signal and the voltage test signal produced by each optical coupler circuit, and determining whether the corresponding electrostatic tester connected to each optical coupler circuit is worked normally according to the connection test signal and the voltage test signal produced by the corresponding optical coupler circuit, via the chip.

13. The method according to claim 12, further comprising:
establishing a number of logical tables each corresponding to a time point according to the time when the chip receiving the connection test signal and the voltage test signal, wherein each logical table comprises a name column, a voltage test signal column, a connection test signal column, a test result column, and a test time column for recording corresponding test data of the corresponding electrostatic tester.

14. The method according to claim 13, further comprising:
sending the logical tables to a server in sequence via a first computer;
analyzing each logical table transmitted by the first computer, and comparing the test time of each logical table to a preset work schedule to determine which duration the test time of each logical table is belonged, and determining a production line number corresponding to the test result of each electrostatic tester according to relationships between the electrostatic testers and production lines via the server;
associating the production line number, the test result, and the test time of each electrostatic tester with each other and store the associated data comprising the production line number, test result, and test time of each electrostatic tester to a corresponding database table according to the test time via the server; and
determining whether a state of the electrostatic tester corresponding to each production line number is normal according to the associated data stored in each database table via the server.

15. The method according to claim 14, wherein the step of associating the production line number, the test result, and the test time of each electrostatic tester with each other and store the associated data comprising the production line number, test result, and test time of each electrostatic tester to a corresponding database table according to the test time via the server comprising:

storing the associated data of each electrostatic tester to a work time database table when the test time of the logical table belongs to the work time of the work schedule; and storing the associated data of each electrostatic tester to a rest time database table when the test time of the logical table belongs to the rest time of the work schedule.

16. The method according to claim 14, wherein the step of determining whether a state of the electrostatic tester corresponding to each production line number is normal according to the associated data stored in each database table via the server comprising:

determining the state of the electrostatic tester is abnormal when determining a number of the test result of one electrostatic tester of the work time database table determined as "abnormal" is greater than a first predetermined times; and determining the state of the electrostatic tester is abnormal when determining a number of the test result of one electrostatic tester of the rest time database table determined as "normal" is greater than a second predetermined times.

\* \* \* \* \*